United States Patent
Lee et al.

(10) Patent No.: US 9,236,101 B2
(45) Date of Patent: Jan. 12, 2016

(54) SEMICONDUCTOR DEVICES INCLUDING DATA ALIGNER

(71) Applicant: SK hynix Inc., Icheon-si Gyeonggi-do (KR)

(72) Inventors: Hyeng Ouk Lee, Yongin-si (KR); Keun Soo Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/301,407

(22) Filed: Jun. 11, 2014

(65) Prior Publication Data

US 2015/0213861 A1 Jul. 30, 2015

(30) Foreign Application Priority Data

Jan. 28, 2014 (KR) .................. 10-2014-0010068

(51) Int. Cl.
- *G11C 7/22* (2006.01)
- *G11C 7/10* (2006.01)
- *G11C 11/4076* (2006.01)
- *G11C 11/4093* (2006.01)

(52) U.S. Cl.
CPC .............. *G11C 7/222* (2013.01); *G11C 7/1012* (2013.01); *G11C 7/1087* (2013.01); *G11C 7/1093* (2013.01); *G11C 7/22* (2013.01); *G11C 11/4076* (2013.01); *G11C 11/4093* (2013.01)

(58) Field of Classification Search
CPC ........ G11C 7/1093; G11C 7/22; G11C 7/222; G11C 7/1087; G11C 7/1012; G11C 11/4076; G11C 11/4093
See application file for complete search history.

(56) References Cited

U.S. PATENT DOCUMENTS

| | | | | |
|---|---|---|---|---|
| 7,042,799 B2 * | 5/2006 | Cho | ................... | 365/185.17 |
| 7,522,459 B2 * | 4/2009 | Do | ................... | 365/193 |
| 7,975,162 B2 * | 7/2011 | Kim et al. | ................... | 713/500 |
| 8,477,543 B2 * | 7/2013 | Kwon | ................... | 365/189.16 |
| 9,013,935 B2 * | 4/2015 | Kim | ................... | 365/194 |
| 2003/0086303 A1 * | 5/2003 | Jeong | ................... | 365/189.05 |
| 2009/0161455 A1 * | 6/2009 | Ku et al. | ................... | 365/193 |
| 2009/0296495 A1 | 12/2009 | Choi et al. | | |
| 2011/0292739 A1 * | 12/2011 | Song | ................... | 365/189.05 |

FOREIGN PATENT DOCUMENTS

KR 1020080048378 A 6/2008

* cited by examiner

*Primary Examiner* — Vanthu Nguyen
(74) *Attorney, Agent, or Firm* — William Park & Associates Ltd.

(57) ABSTRACT

The semiconductor device includes a first data aligner, an input strobe signal generator and a second data aligner. The first data aligner aligns input data in synchronization with an internal strobe signal to generate alignment data. The input strobe signal generator generates first and second delay signals from the internal strobe signal. The input strobe signal generator also latches an input clock signal generated from an external clock signal after a write latency period from a period when a write operation commences, in response to the first and second delay signals to generate an input strobe signal. The second data aligner re-aligns the alignment data in synchronization with the input strobe signal to generate internal data.

18 Claims, 6 Drawing Sheets

SEMICONDUCTOR DEVICES INCLUDING DATA ALIGNER

CROSS-REFERENCE TO RELATED APPLICATION

The present application claims priority under 35 U.S.C 119(a) to Korean Application No. 10-2014-0010068, filed on Jan. 28, 2014, in the Korean Intellectual Property Office, which is incorporated herein by reference in its entirety as set forth in full.

BACKGROUND

1. Technical Field

Embodiments of the invention relate to semiconductor devices.

2. Related Art

In general, semiconductor devices such as double data rate synchronous dynamic random access memory (DDR SDRAM) devices include a plurality of memory cells to store data therein or to output the data stored therein according to a command outputted from a controller. That is, if a write command signal and an address signal generated from the controller is applied to the semiconductor device, the semiconductor device may store external data in the memory cell(s) corresponding to the address signal. In addition, if a read command signal and an address signal generated from the controller is applied to the semiconductor device, the semiconductor device may output the data stored in the memory cell(s) corresponding to the address signal. In other words, external data inputted through pads of the semiconductor device in a write mode may be stored in the memory cells of the semiconductor devices through a data input path, and data stored in the memory cells of the semiconductor device may be outputted through a data output path and the pads in a read mode.

SUMMARY

According to an embodiment, a semiconductor device includes a first data aligner, an input strobe signal generator and a second data aligner. The first data aligner is suitable for aligning input data in synchronization with an internal strobe signal to generate alignment data. The input strobe signal generator is suitable for generating first and second delay signals from the internal strobe signal and for latching an input clock signal. The input clock signal is generated from an external clock signal after a write latency period from a period when a write operation commences, in response to the first and second delay signals to generate an input strobe signal. The second data aligner is suitable for re-aligning the alignment data in synchronization with the input strobe signal to generate internal data.

According to an embodiment, a semiconductor device includes a first data aligner, an input strobe signal generator and a second data aligner. The first data aligner is suitable for aligning first to eighth input data in synchronization with an internal strobe signal to generate first to eighth alignment data. The input strobe signal generator is suitable for generating first and second delay signals from the internal strobe signal and latching first and second input clock signals. The first and second input clock signals are generated from an external clock signal after a write latency period from a period when a write operation commences, in response to the first and second delay signals to generate first and second input strobe signals. The second data aligner is suitable for re-aligning the first to eighth alignment data in synchronization with the first and second input strobe signals to generate first to eighth internal data.

According to an embodiment, a semiconductor device includes a delay signal generator, an input clock generator, a latch unit and a data aligner. The delay signal generator is suitable for retarding an internal strobe signal to generate the first delay signal and the second delay signal. The input clock generator is suitable for generating an input clock signal in response to an external clock signal, a write command signal and a write latency signal. The latch unit is suitable for latching the input clock signal from a period when a pulse of the second delay signal is inputted. The latch unit is also suitable for generating the input strobe signal from a period when a pulse of the internal strobe signal is inputted thereto. The data aligner is suitable for aligning alignment data in synchronization with the input strobe signal to generate internal data.

DETAILED DESCRIPTION

Various embodiments of the inventive concept will be described hereinafter with reference to the accompanying figures. However, the embodiments described are for illustrative purposes only and are not intended to limit the scope of the inventive concept. Semiconductor devices have been continuously developed to become more highly integrated and to operate at a high speed. As a result, the number of data serially inputted through a single pad becomes more increased. Various embodiments are directed to semiconductor devices. Accordingly, the data serially inputted through a single pad are aligned in parallel through an alignment operation. In addition, the data aligned in parallel are transmitted to a plurality of global input/output (I/O) lines corresponding to internal global data lines of the semiconductor device.

Figure 1:
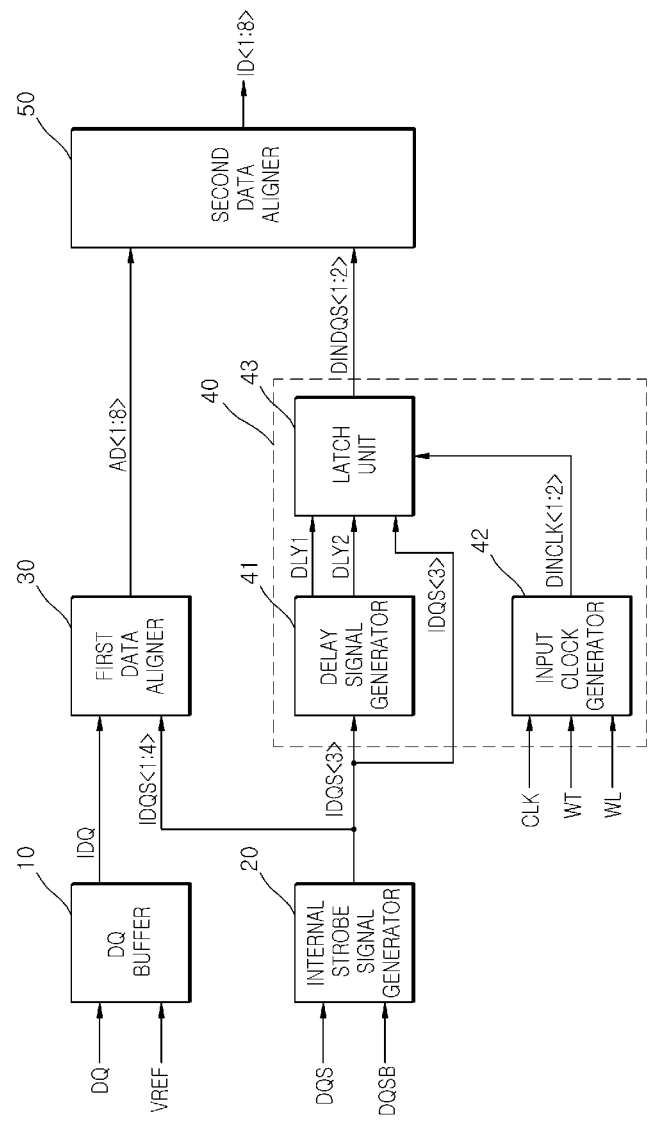
FIG. 1 is a block diagram illustrating a semiconductor device according to an embodiment of the inventive concept.

Referring to FIG. 1, in an embodiment, a semiconductor device may include a data (DQ) buffer 10, an internal strobe signal generator 20, a first data aligner 30, an input strobe signal generator 40 and a second data aligner 50.

The data buffer 10 may be configured to compare data DQ inputted through data pads with a reference voltage signal VREF to generate input data IDQ. The reference voltage signal VREF may be set to have a voltage level to discriminate logic levels of the data DQ.

The internal strobe signal generator 20 may be configured to receive a data strobe signal DQS and an inverse data strobe signal DQSB to generate first to fourth internal strobe signals IDQS<1:4> divided in frequency. The first to fourth internal strobe signals IDQS<1:4> may be generated to have different phases. A phase difference between the first to fourth internal strobe signals IDQS<1:4> may be set to be different according to various embodiments.

The first data aligner 30 may be configured to latch the input data IDQ serially inputted in synchronization with the first to fourth internal strobe signals IDQS<1:4>. In addition, the first data aligner 30 may align the latched input data IDQ to generate first to eighth alignment data AD<1:8>. An operation to generate the first to eighth alignment data AD<1:8> will be described in detail with reference to FIG. 5. Although the embodiment is described in conjunction with eight alignment data AD<1:8>, the inventive concept is not limited to only eight alignment data AD<1:8>. More specifically, the number of the alignment data may be set according to the number of the input data IDQ serially inputted to the first data aligner 30.

The input strobe signal generator 40 may be configured to include a delay signal generator 41, an input clock generator 42 and a latch unit 43. The delay signal generator 41 may be configured to retard the third internal strobe signal IDQS<3> to generate a first delay signal DLY1 and a second delay signal DLY2. The input clock generator 42 may be configured to receive an external clock signal CLK, a write command signal WT and a write latency signal WL to generate first and second input clock signals DINCLK<1:2>. The first and second input clock signals DINCLK<1:2> are sequentially enabled after a write latency period from a point of time that the write command signal WT is inputted. The write latency period may correspond to a period from a point of time that the write command signal WT is inputted until data are inputted. The latch unit 43 may be configured to latch the first and second input clock signals DINCLK<1:2> at a point of time that a pulse of the second delay signal DLY2 is inputted. In addition, the latch unit may generate first and second input strobe signals DINDQS<1:2> from the latched first and second input clock signals DINCLK<1:2> at a point of time that a pulse of the third internal strobe signal IDQS<3> is inputted. More specifically, the input strobe signal generator 40 may be configured to generate the first and second delay signals DLY1 and DLY2 from the third internal strobe signal IDQS<3> among the first to fourth internal strobe signals IDQS<1:4>. In addition, the input strobe signal generator 40 may latch the first and second input clock signals DINCLK<1:2>, generated after a write latency period from when a write operation commences, in response to the first and second delay signals DLY1 and DLY2 to generate the first and second input strobe signals DINDQS<1:2>. The input strobe signal generator 40 may be configured to receive any one of the first to fourth internal strobe signals IDQS<1:4> to generate the first and second input strobe signals DINDQS<1:2> according to various embodiments.

The second data aligner 50 may be configured to latch the first to eighth alignment data AD<1:8> in synchronization with the first and second input strobe signals DINDQS<1:2>. In addition, the second data aligner 50 may re-align the latched first to eighth alignment data AD<1:8> to generate first to eighth internal data ID<1:8>. Further, the second data aligner 50 may re-align the first to eighth alignment data AD<1:8> at a point of time that the second input strobe signal DINDQS<2> is inputted. The second data aligner 50 may also output the re-aligned first to eighth alignment data AD<1:8> as the first to eighth internal data ID<1:8>.

Figure 2:
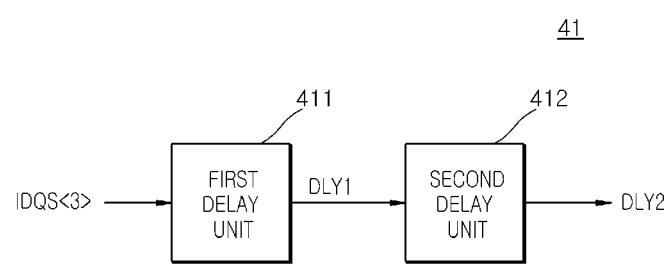
FIG. 2 is a block diagram illustrating a delay signal generator included in the semiconductor device of FIG. 1.

Referring to FIG. 2, the delay signal generator 41 may be configured to include a first delay unit 411 and a second delay unit 412.

The first delay unit 411 may be configured to reverse and retard the third internal strobe signal IDQS<3> to generate the first delay signal DLY1.

The second delay unit 412 may be configured to reverse and retard the first delay signal DLY1 to generate the second delay signal DLY2.

The delay times of the first and second delay units 411 and 412 may be set to be different according to various embodiments.

Figure 3:
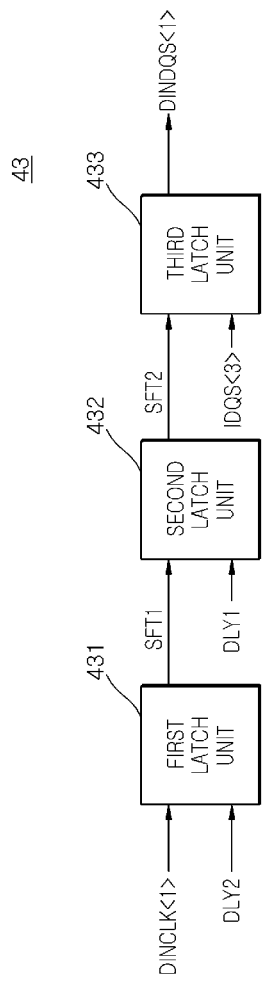
FIG. 3 is a block diagram illustrating a latch unit included in the semiconductor device of FIG. 1.

Referring to FIG. 3, the latch unit 43 may be configured to include a first latch unit 431, a second latch unit 432 and a third latch unit 433.

The first latch unit 431 may be configured to latch the first input clock signal DINCLK<1> to generate a first shifting signal SFT1 when a pulse of the second delay signal DLY2 is inputted.

The second latch unit 432 may be configured to latch the first shifting signal SFT1 to generate a second shifting signal SFT2 when a pulse of the first delay signal DLY1 is inputted.

The third latch unit 433 may be configured to latch the second shifting signal SFT2 to generate the first input strobe signal DINDQS<1> when a pulse of the third internal strobe signal IDQS<3> is inputted.

An operation to generate the second input strobe signal DINDQS<2> from the second input clock signal DINCLK<2> may be substantially similar as the operation to generate the first input strobe signal DINDQS<1> from the first input clock signal DINCLK<1>. Therefore, a detailed description of the operation to generate the second input strobe signal DINDQS<2> from the second input clock signal DINCLK<2> will be omitted.

Figure 4:
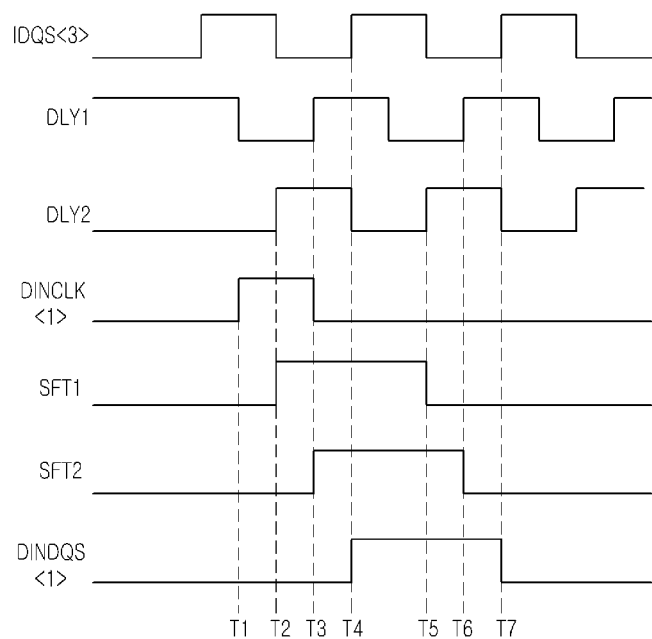
FIG. 4 is a timing diagram illustrating an operation of an input strobe signal generator included in the semiconductor device of FIG. 1.

An operation of the input strobe signal generator 40 having the aforementioned configuration will be described with reference to FIG. 4 in conjunction with an example that the first input strobe signal DINDQS<1> is generated from the first input clock signal DINCLK<1>.

The first delay unit 411 of the delay signal generator 41 may reverse and retard the third internal strobe signal IDQS<3> to generate the first delay signal DLY1. The second delay unit 411 may then reverse and retard the delay signal DLY1 to generate the second delay signal DLY2.

At time "T1" that a write latency period elapses after a write operation commences, the input clock generator 42 may be configured to generate the first input clock signal DINCLK<1> having a logic "high" level.

Subsequently, at time "T2," the first latch unit 431 of the latch unit 43 may be configured to latch the first input clock signal DINCLK<1> having a logic "high" level in response to a pulse of the second delay signal DLY2 with a logic "high" level to generate the first shifting signal SFT1 with a logic "high" level.

Subsequently, at time "T3," the second latch unit 432 of the latch unit 43 may latch the first shifting signal SFT1 with a logic "high" level in response to a pulse of the first delay signal DLY1 with a logic "high" level to generate the second shifting signal SFT2 with a logic "high" level.

Subsequently, at time "T4," the third latch unit 433 of the latch unit 43 may latch the second shifting signal SFT2 with a logic "high" level in response to a pulse of the third internal strobe signal IDQS<3> with a logic "high" level to generate the first input strobe signal DINDQS<1> with a logic "high" level.

Further, at time "T5," the input clock generator 42 may generate the first input clock signal DINCLK<1> having a logic "low" level. The first latch unit 431 of the latch unit 43 may latch the first input clock signal DINCLK<1> having a logic "low" level in response to a pulse of the second delay signal DLY2 having a logic "high" level. The first latch unit 431 may latch the first input clock signal DINCLK<1> to generate the first shifting signal SFT1 having a logic "low" level.

Subsequently, at time "T6," the second latch unit 432 of the latch unit 43 may latch the first shifting signal SFT1 having a logic "low" level in response to a pulse of the first delay signal DLY1 having a logic "high" level. The second latch unit 432 may latch the first shifting signal SFT1 to generate the second shifting signal SFT2 having a logic "low" level.

Further, at "T7," the third latch unit 433 of the latch unit 43 may latch the second shifting signal SFT2 having a logic "low" level in response to a pulse of the third internal strobe signal IDQS<3> having a logic "high" level. The third latch unit 433 may latch the second shifting signal SFT2 to generate the first input strobe signal DINDQS<1> having a logic "low" level.

As described above, the input strobe signal generator 40 may generate the first and second delay signals DLY1 and DLY2 from the third internal strobe signal IDQS<3>. In addition, the input strobe signal generator 40 may latch the first and second input clock signals DINCLK<1:2> sequentially generated after a write latency period from a point of time that a write operation commences, in response to the first and second delay signals DLY1 and DLY2. The input strobe signal generator 40 may latch the first and second input clock signals DINCLK<1:2> to generate the first and second input strobe signals DINDQS<1:2>.

Figure 5:
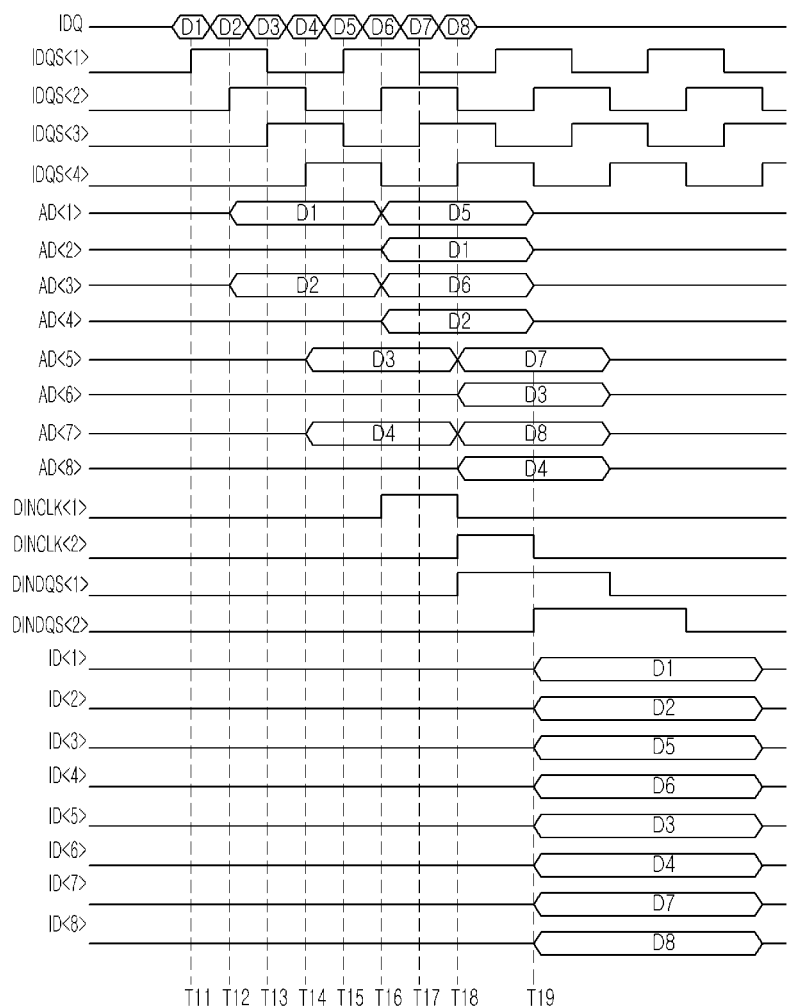
FIG. 5 is a timing diagram illustrating an operation of a semiconductor device according to an embodiment of the inventive concept.

An operation of the semiconductor device having the aforementioned configuration will be described with reference to FIG. 5 in conjunction with an example that the semiconductor device serially receives eight data DQ in a write mode. In addition, the semiconductor device will be described to align the eight data DQ to generate the first to eighth internal data ID<1:8>.

First, the data (DQ) buffer 10 may be configured to compare the data DQ serially inputted through data pads with the reference voltage signal VREF to generate the input data IDQ in a write mode.

Subsequently, at time "T11," the internal strobe signal generator 20 may be configured to receive the data strobe signal DQS and the inverse data strobe signal DQSB to generate the first internal strobe signal IDQS<1> having a logic "high" level. The first data aligner 30 may be configured to latch a first data D1 of the input data IDQ in synchronization with the first internal strobe signal IDQS<1> having a logic "high" level.

Subsequently, at time "T12," the internal strobe signal generator 20 may be configured to receive the data strobe signal DQS and the inverse data strobe signal DQSB to generate the second internal strobe signal IDQS<2> having a logic "high" level. The first data aligner 30 may be configured to latch a second data D2 of the input data IDQ in synchronization with the second internal strobe signal IDQS<2> having a logic "high" level. In such a case, the first data aligner 30 may be configured to align the first data D1 latched at time "T11" to output the aligned first data D1 as the first alignment data AD<1>. Further the first data aligner 30 may be configured to align the second data D2 to output the aligned second data D2 as the third alignment data AD<3>.

As a result, at time "T13," the internal strobe signal generator 20 may be configured to receive the data strobe signal DQS and the inverse data strobe signal DQSB to generate the third internal strobe signal IDQS<3> having a logic "high" level. The first data aligner 30 may be configured to latch a third data D3 of the input data IDQ in synchronization with the third internal strobe signal IDQS<3> having a logic "high" level.

Subsequently, at time "T14," the internal strobe signal generator 20 may be configured to receive the data strobe signal DQS and the inverse data strobe signal DQSB to generate the fourth internal strobe signal IDQS<4> having a logic "high" level. The first data aligner 30 may be configured to latch a fourth data D4 of the input data IDQ in synchronization with the fourth internal strobe signal IDQS<4> having a logic "high" level. In such a case, the first data aligner 30 may be configured to align the third data D3 latched at time "T13" to output the aligned third data D3 as the fifth alignment data AD<5>. Further, the first data aligner 30 may align the fourth data D4 to output the aligned fourth data D4 as the seventh alignment data AD<7>.

Accordingly, at time "T15," the internal strobe signal generator 20 may be configured to receive the data strobe signal DQS and the inverse data strobe signal DQSB to generate the first internal strobe signal IDQS<1> having a logic "high" level. The first data aligner 30 may be configured to latch a fifth data D5 of the input data IDQ in synchronization with the first internal strobe signal IDQS<1> having a logic "high" level.

Subsequently, at time "T16," the internal strobe signal generator 20 may be configured to receive the data strobe signal DQS and the inverse data strobe signal DQSB to generate the second internal strobe signal IDQS<2> having a logic "high" level. The first data aligner 30 may be configured to latch a sixth data D6 of the input data IDQ in synchronization with the second internal strobe signal IDQS<2> having a logic "high" level. In such a case, the first data aligner 30 may be configured to align the first alignment data AD<1> corresponding to the first data D1 latched at time "T11" to output it as the second alignment data AD<2>. In addition, the first data aligner 30 may be configured to align the fifth data D5 latched at time "T15" to output it as the first alignment data AD<1>. Further, the first data aligner 30 may be configured to align the third alignment data AD<3> corresponding to the second data D2 latched at time "T12" to output it as the fourth alignment data AD<4>. The first data aligner 30 may also align the sixth data D6 of the input data IDQ to output it as the third alignment data AD<3>. The input clock generator 42 of the input strobe signal generator 40 may be configured to generate the first input clock signal DINCLK<1> having a logic "high" level after a write latency period from a point of time in which a write operation commences. The latch unit 43 may be configured to latch the first input clock signal DIN-CLK<1> having a logic "high" level.

Accordingly, at a point of time "T17," the internal strobe signal generator 20 may be configured to receive the data strobe signal DQS and the inverse data strobe signal DQSB to generate the third internal strobe signal IDQS<3> having a logic "high" level. The first data aligner 30 may be configured to latch a seventh data D7 of the input data IDQ in synchronization with the third internal strobe signal IDQS<3> having a logic "high" level.

Further, at time "T18," the internal strobe signal generator 20 may be configured to receive the data strobe signal DQS and the inverse data strobe signal DQSB to generate the fourth internal strobe signal IDQS<4> having a logic "high" level. The first data aligner 30 may be configured to latch an eighth data D8 of the input data IDQ in synchronization with the fourth internal strobe signal IDQS<4> having a logic "high" level. In such a case, the first data aligner 30 may be configured to align the fifth alignment data AD<5> corresponding to the third data D3 latched at time "T13" to output it as the sixth alignment data AD<6>. The first data aligner 30 may also align the seventh data D7 latched at time "T17" to output it as the fifth alignment data AD<5>. In addition, the first data aligner 30 may align the seventh alignment data AD<7> corresponding to the fourth data D4 latched at time "T14" to output it as the eighth alignment data AD<8>. The first data aligner 30 may also align the eighth data D8 of the input data IDQ to output it as the seventh alignment data AD<7>. The input clock generator 42 of the input strobe signal generator 40 may be configured to generate the second input clock signal DINCLK<2> having a logic "high" level after the write latency period from the time that the write operation commences. The latch unit 43 may be configured to latch the second input clock signal DINCLK<2> having a logic "high" level and generate the first input strobe signal DINDQS<1> having a logic "high" level from the first input clock signal DINCLK<1> latched at time "T16." The second data aligner 50 may be configured to latch the first to fourth alignment data AD<1:4> in synchronization with the first input strobe signals DINDQS<1> having a logic "high" level.

Subsequently, at time "T19," the latch unit 43 of the input strobe signal generator 40 may be configured to generate the second input strobe signal DINDQS<2> having a logic "high" level from the second input clock signal DINCLK<2> latched at time "T18." The second data aligner 50 may be configured to align the second alignment data AD<2> corresponding to the first data D1 of the input data IDQ in synchronization with the second input strobe signal DINDQS<2> to output it as the first internal data ID<1>. The second data aligner 50 may also align the fourth alignment data AD<4> corresponding to the second data D2 of the input data IDQ in synchronization with the second input strobe signal DINDQS<2> to output it as the second internal data ID<2>. Moreover, the second data aligner 50 may be configured to align the first alignment data AD<1> corresponding to the fifth data D5 of the input data IDQ in synchronization with the second input strobe signal DINDQS<2> to output it as the third internal data ID<3>. The second data aligner 50 may also align the third alignment data AD<3> corresponding to the sixth data D6 of the input data IDQ in synchronization with the second input strobe signal DINDQS<2> to output it as the fourth internal data ID<4>. Furthermore, the second data aligner 50 may be configured to align the sixth alignment data AD<6> corresponding to the third data D3 of the input data IDQ in synchronization with the second input strobe signal DINDQS<2> to output it as the fifth internal data ID<5>. In addition, the second data aligner 50 may align the eighth alignment data AD<8> corresponding to the fourth data D4 of the input data IDQ in synchronization with the second input strobe signal DINDQS<2> to output it as the sixth internal data ID<6>. Further, the second data aligner 50 may be configured to align the fifth alignment data AD<5> corresponding to the seventh data D7 of the input data IDQ in synchronization with the second input strobe signal DINDQS<2> to output it as the seventh internal data ID<7>. The second data aligner 50 may also align the seventh alignment data AD<7> corresponding to the eighth data D8 of the input data IDQ in synchronization with the second input strobe signal DINDQS<2> to output it as the eighth internal data ID<8>.

Figure 6:
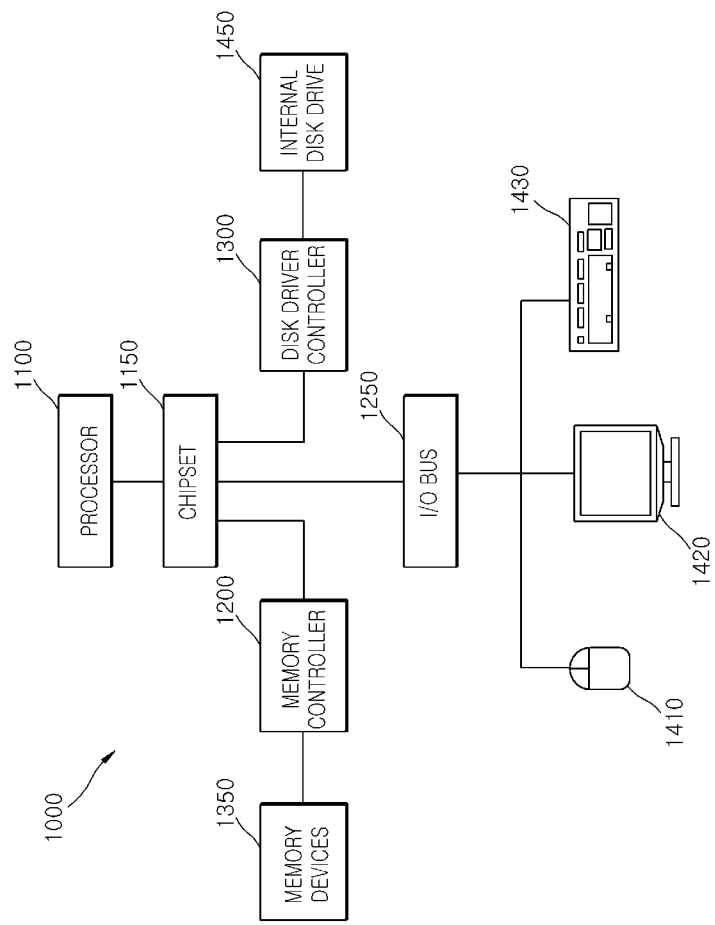
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may be electrically coupled to the processor 1100. The chipset 1150 may be a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The internal disk drive 1450 and the disk drive controller 1300 may communicate with each other or with the chipset 1150 using virtually any type of communication protocol.

As described above, the semiconductor device according to the embodiments may align in parallel a plurality of data inputted in series thereto to generate a plurality of internal data.

What is claimed is:
1. A semiconductor device comprising:
   a first data aligner suitable for aligning input data in synchronization with an internal strobe signal to generate alignment data;
   an input strobe signal generator suitable for generating first and second delay signals from the internal strobe signal and latching an input clock signal generated from an external clock signal after a write latency period from a period when a write operation commences, in response to the first and second delay signals to generate an input strobe signal; and
   a second data aligner suitable for re-aligning the alignment data in synchronization with the input strobe signal to generate internal data,
   wherein the input strobe signal is enabled at a period when a pulse of the internal strobe signal is inputted to the input strobe signal generator after the input clock signal is generated.

2. The semiconductor device of claim 1, wherein the first delay signal is generated by reversing and retarding the internal strobe signal and the second delay signal is generated by reversing and retarding the first delay signal.

3. The semiconductor device of claim 1, wherein the input strobe signal generator includes:
   a delay signal generator suitable for retarding the internal strobe signal to generate the first delay signal and the second delay signal;
   an input clock generator suitable for generating the input clock signal in response to the external clock signal, a write command signal and a write latency signal; and
   a latch unit suitable for latching the input clock signal at a period when a pulse of the second delay signal is inputted and generating the input strobe signal at a period when a pulse of the internal strobe signal is inputted thereto.

4. The semiconductor device of claim 3, wherein the delay signal generator includes:
  a first delay unit suitable for reversing and retarding the internal strobe signal to generate the first delay signal; and
  a second delay unit suitable for reversing and retarding the first delay signal to generate the second delay signal.

5. The semiconductor device of claim 3, wherein the latch unit includes:
  a first latch unit suitable for latching the input clock signal to generate a first shifting signal when a pulse of the second delay signal is inputted;
  a second latch unit suitable for latching the first shifting signal to generate a second shifting signal when a pulse of the first delay signal is inputted; and
  a third latch unit suitable for latching the second shifting signal to generate the input strobe signal when a pulse of the internal strobe signal is inputted.

6. The semiconductor device of claim 1, further comprising:
  a data buffer suitable for comparing data inputted through data pads with a reference voltage signal to generate the input data; and
  an internal strobe signal generator suitable for receiving a data strobe signal and an inverse data strobe signal to generate the internal strobe signal divided in frequency.

7. A semiconductor device comprising:
  a first data aligner suitable for aligning first to eighth input data in synchronization with an internal strobe signal to generate first to eighth alignment data;
  an input strobe signal generator suitable for generating first and second delay signals from the internal strobe signal and latching first and second input clock signals generated from an external clock signal after a write latency period from a period when a write operation commences, in response to the first and second delay signals to generate first and second input strobe signals; and
  a second data aligner suitable for re-aligning the first to eighth alignment data in synchronization with the first and second input strobe signals to generate first to eighth internal data,
  wherein the first input strobe signal is enabled from a period when a pulse of the internal strobe signal is inputted to the input strobe signal generator after the first input clock signal is generated; and
  wherein the second input strobe signal is enabled from a period when a pulse of the internal strobe signal is inputted to the input strobe signal generator after the second input clock signal is generated.

8. The semiconductor device of claim 7, wherein the first delay signal is generated by reversing and retarding the internal strobe signal and the second delay signal is generated by reversing and retarding the first delay signal.

9. The semiconductor device of claim 7, wherein the input strobe signal generator includes:
  a delay signal generator suitable for retarding the internal strobe signal to generate the first delay signal and the second delay signal;
  an input clock generator suitable for generating the first and second input clock signals in response to the external clock signal, a write command signal and a write latency signal; and
  a latch unit suitable for latching the first and second input clock signals from a period when a pulse of the second delay signal is inputted and generating the first and second input strobe signals at a period when a pulse of the internal strobe signal is inputted thereto.

10. The semiconductor device of claim 9, wherein the delay signal generator includes:
  a first delay unit suitable for reversing and retarding the internal strobe signal to generate the first delay signal; and
  a second delay unit suitable for reversing and retarding the first delay signal to generate the second delay signal.

11. The semiconductor device of claim 9, wherein the latch unit includes:
  a first latch unit suitable for latching the first input clock signal to generate a first shifting signal when a pulse of the second delay signal is inputted;
  a second latch unit suitable for latching the first shifting signal to generate a second shifting signal when a pulse of the first delay signal is inputted; and
  a third latch unit suitable for latching the second shifting signal to generate the first input strobe signal when a pulse of the internal strobe signal is inputted.

12. A semiconductor device comprising:
  a delay signal generator suitable for retarding an internal strobe signal to generate the first delay signal and the second delay signal;
  an input clock generator suitable for generating an input clock signal in response to an external clock signal, a write command signal and a write latency signal;
  a latch unit suitable for latching the input clock signal at a period when a pulse of the second delay signal is inputted and generating the input strobe signal at a period when a pulse of the internal strobe signal is inputted; and
  a data aligner suitable for aligning alignment data in synchronization with the input strobe signal to generate internal data.

13. The semiconductor device of claim 12, wherein the first delay signal is generated by reversing and retarding the internal strobe signal.

14. The semiconductor device of claim 12, wherein the second delay signal is generated by reversing and retarding the first delay signal.

15. The semiconductor device of claim 12, wherein the input clock signal is generated from the external clock signal after a write latency period from a period when a write operation occurs.

16. The semiconductor device of claim 12, wherein the input strobe signal is enabled at a period when a pulse of the internal strobe signal is inputted to the latch unit after the input clock signal is generated.

17. The semiconductor device of claim 12, wherein the delay signal generator includes:
  a first delay unit suitable for reversing and retarding the internal strobe signal to generate the first delay signal; and
  a second delay unit suitable for reversing and retarding the first delay signal to generate the second delay signal.

18. The semiconductor device of claim 12, wherein the latch unit includes:
  a first latch unit suitable for latching the input clock signal to generate a first shifting signal when a pulse of the second delay signal is inputted;
  a second latch unit suitable for latching the first shifting signal to generate a second shifting signal when a pulse of the first delay signal is inputted; and
  a third latch unit suitable for latching the second shifting signal to generate the input strobe signal when a pulse of the internal strobe signal is inputted.

* * * * *